(12) United States Patent
Hacke et al.

(10) Patent No.: US 6,256,877 B1
(45) Date of Patent: Jul. 10, 2001

(54) METHOD FOR TRANSFORMING A SUBSTRATE WITH EDGE CONTACTS INTO A BALL GRID ARRAY

(75) Inventors: Hans-Juergen Hacke; Manfred Wossler; Karl Weidner; Wolfgang Radlik, all of Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/209,406

(22) Filed: Dec. 10, 1998

(30) Foreign Application Priority Data

Dec. 10, 1997  (DE) .............................. 197 54 874

(51) Int. Cl.⁷ ....................................... H05K 3/30
(52) U.S. Cl. ..................... 29/832; 174/254; 174/260; 29/840; 228/180.22
(58) Field of Search ................... 29/840, 832, 825; 228/179, 180.21, 180.22; 174/260, 254

(56) References Cited

U.S. PATENT DOCUMENTS 4,295,695 * 10/1981 Dodds .
5,284,287    2/1994 Wilson et al. .
5,362,656 * 11/1994 McMahon .

FOREIGN PATENT DOCUMENTS 195 35 622   9/1996 (DE) .
9-283560    10/1997 (JP) .
WO 89/10005 10/1989 (WO) .

OTHER PUBLICATIONS

Patent Abstracts of Japan for Application No. 07271912, 09092678A, Apr. 4, 1997.
Patent Abstracts of Japan for Application No. 06169352, 08031868A, Feb. 2, 1996.
Patent Abstracts of Japan for Application No. 07135218, 08330361A, Dec. 13, 1996.
Patent Abstracts of Japan for Application No. 07144350, 8340021A, Dec. 24, 1996.
"BGA—die Alternative," Low Cost Multi Chip Module im Ball Grid Array Package, Productronic, vol. 5, (1994), pp. 54–55.

* cited by examiner

*Primary Examiner*—Jeffrey Gaffin
*Assistant Examiner*—Kamand Cuneo
(74) *Attorney, Agent, or Firm*—Schiff Hardin & Waite

(57) ABSTRACT

The transformation of An IC substrate with edge contacts into a ball grid array is accomplished using a flexible circuit that has terminals arranged planarly on the underside for receiving meltable solder humps and whose conductors leading outwardly from the terminals have exposed ends. The upper side of the flexible circuit is connected with the lower side of the substrate, whereupon the edge regions of the flexible circuit are bent up and around the substrate and the ends of the conductors are electrically contacted to the edge contacts of the substrate.

5 Claims, 1 Drawing Sheet

METHOD FOR TRANSFORMING A SUBSTRATE WITH EDGE CONTACTS INTO A BALL GRID ARRAY

BACKGROUND OF THE INVENTION

1. Field of the Invention

The present invention is directed to a method for transforming a substrate with edge contacts into a ball grid array, a ball grid array manufactured according to this method, and flexible wiring for the transformation of a substrate with edge contacts into a ball grid array

2. Description of the Prior Art

In the manufacturing of multichip modules (MCM), i.e. systems with one or more unencapsulated integrated circuits on a flexible circuit (conductor pattern) film, the problem arises of contacting this module on an element that is a continuation of the circuit. Specially formed edge terminals are conventionally used that are then soldered. e.g. in the strap soldering method, with a circuit board that continues the circuit. As in the case of encapsulated components for surface mounting, the increasing number of terminals and the drive towards miniaturization leads to an ever-smaller terminal grid. This in turn causes difficulties in mounting, from the application of the soldering paste in a defined manner to the short-circuit-free soldering with the soldering strap.

With respect to the above-named difficulties, ball grid arrays (BGAs) are increasingly being used both for individual chips and for multichip modules, in which BGAs the terminals are distributed in planar fashion and thus in an essentially coarser grid than in the conventional forms on the underside of the housing. Each of these planarly distributed terminals supports one or more humps that can be melted, known as balls, which provide the connection with the conductors (circuit) in a melting process (cf. DE-Z Productronic Vol. 5, 1994, pages 54, 55).

If the wirings of the multichip modules are manufactured in circuit board technology (known as MCM-L), the ball grid array can be realized easily. Through-contacts through the substrate enable a planar arrangement of the terminals or of the meltable humps on the underside. Likewise, given multilayer ceramics manufactured in sinter technology with a thick layer wiring (called MCM-C), a planar arrangement of the terminals or of the meltable humps is possible.

If, however, the multichip modules are manufactured by deposition of layers on an unstructured substrate, e.g. ceramic (called MCM-D), this substrate will only outwardly have edge contacts for the connection; i.e., assembly as a ball grid array is not possible without taking further steps.

From PCT Application WO 89/10005, a chip packaging is known in which a preformed substrate has a receptacle at its upper side for receiving an integrated circuit, and has four ribs on its lower side that project beyond the outer edge. A flexible wiring, with an opening corresponding to the receptacle, is applied on the upper side of the substrate, and is bent downwardly around the ribs such that the ends of the individual conductors form terminals in the region of the ribs. These terminals, however, are edge contacts located underneath; i.e., a realization as a ball grid array is also not possible in this technique.

SUMMARY OF THE INVENTION

It is an object of the present invention to provide a method transforming a substrate with edge contacts into a ball grid array in a simple way.

The invention proceeds from a recognition that, based on TAB (Tape Automated Bonding) technology, a flexible circuit (conductor pattern) film can be manufactured with planarly distributed terminals, with the conductors leading outwardly from these terminals having exposed ends, i.e. the flexible foil or film that serves as a support material is either not present in the end region of the conductors or has been removed. A flexible conductor pattern fashioned in this way can then be connected with the underside of the IC substrate, by bending the edges of the conductor pattern up and around the sides of the substrate and the ends of the conductors are contacted to the edge contacts on the upper side of the substrate. For manufacturing the ball grid array, it is then necessary only to apply meltable humps or balls onto the planarly distributed terminals of the flexible conductor pattern. Thus, the flexible conductor pattern enables processing as a ball grid array, with all the advantages that this construction offers over fine-grid edge contacts, particularly in larger sizes. If needed, the entire construction can be covered, extrusion-coated, encapsulated, or provided with a cap.

The support film can be provided with a slot-shaped opening at the end regions of the conductors, which enables a particularly simple construction of the exposed ends of the conductors. In the realization, proven methods of TAB technology can be used.

An additional slot-shaped opening can be provided in the support film at a region of the film which will cover a lower edge of the substrate. This facilitates the bending of the flexible wiring around the lower edge of the substrate.

The conductor layout of the flexible circuit can be covered with solder resist. By means of the protective action of the solder resist, the application of meltable balls and also the connection of the finished ball grid array with a continuing circuit are facilitated.

An adhesive between the upper side of the flexible circuit and the underside of the substrate enables a simple and reliable whole-surface connection between the upper side of the flexible circuit and the lower side of the substrate.

DESCRIPTION OF THE PREFERRED EMBODIMENTS

Figure 1:
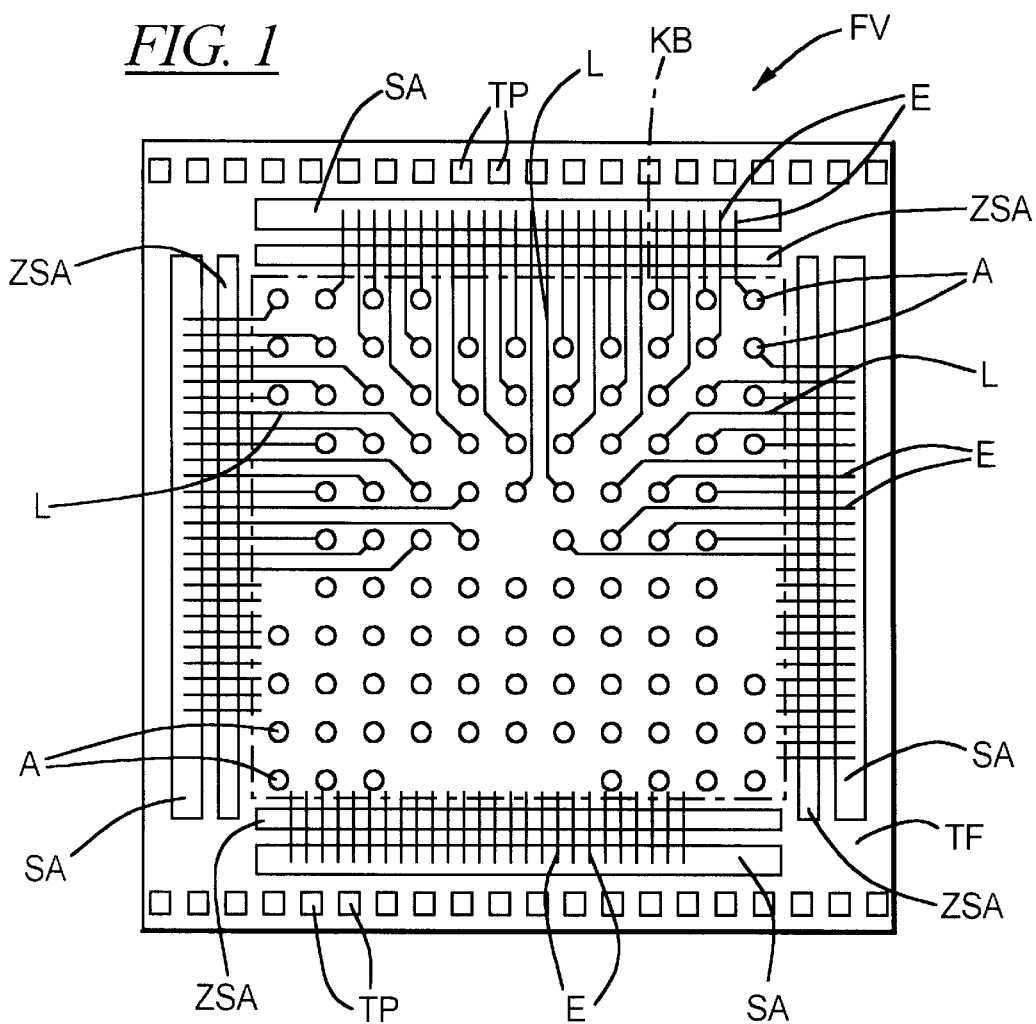
FIG. 1 shows a top view of a flexible circuit (conductor pattern) for transforming a substrate with edge contacts into a ball grid array in accordance with the invention.

FIG. 1 shows a top view of the lower side of a flexible circuit designated FV as a whole, having a support film TF, a number of terminals A arranged in a regular grid, and conductors L leading outwardly from these terminals A. The flexible circuit FV is manufactured on the basis of TAB technology, and the support film TF is correspondingly provided with a transport perforation TP on its upper and lower edge respectively. The terminals A, which form a grid array, are arranged inside a square core region of the flexible circuit FV, this core region being indicated in FIG. 1 by a dotted line KB. In the embodiment shown in FIG. 1, the conductor layout of the flexible circuit FV is designed so that the conductors L proceeding outwardly from the terminals A are led out in groups from all four sides, and the exposed ends E of the conductors respectively emerged via slot-shaped openings SA of the support film TF. An additional slot-shaped opening ZSA is respectively made in the support film TF between the slot-shaped openings SA, of which there are four in all, and the core region KB. The slot-shaped openings SA are disposed at locations in said supporting film TF which will come to be substantially adjacent to upper corners of a substrate S when the support film TF is bent upwardly around the sides of the substrate S. The additional slot-shaped openings ZSA are substantially parallel to the slot-shaped openings SA, and are disposed at a location which will be substantially adjacent to lower corners of the substrate S, when the support film TF is bent around the sides of the substrate S.

The support film TF is made of a heat-resistant polymer, such as e.g. polyamide. The manufacture of the conductor pattern or layout comprising the terminals A and the conductors L can be carried out in conventional technology, such as e.g. in additive technology or in subtractive technology. The conductor layout consists of an electrically conductive material, preferably copper. The regions of the terminals A can additionally be provided, if warranted, with a galvanically deposited tin or tin-lead layer. The slot-shaped openings S and the additional slot-shaped openings ZSA can for example be made in the support film TF by chemical physical etching or by laser ablation. It is thereby important that the individual conductors L that traverse the additional slot-shaped openings ZSA, and the ends E of the conductors L emerging via the slot-shaped openings A, are not damaged during the removal of material.

The flexible circuit FV described above on the basis of FIG. 1 has a structure and design specifically for the purpose of transforming a substrate with edge contacts into a ball grid array.

Figure 2:
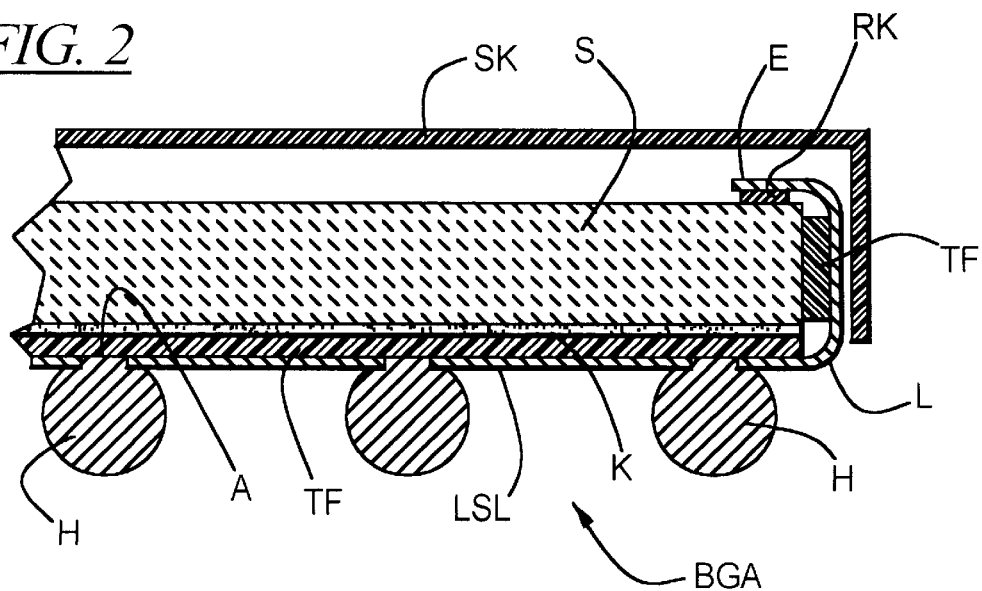
FIG. 2 shows a cross-section through a portion of a substrate with edge contacts, which is transformed into a ball grid array in accordance with the invention using the flexible circuit shown in FIG. 1.

FIG. 2 shows a highly simplified representation of a cross-section through such a substrate, designated S as a whole, provided in all four edge regions with edge contacts RK at a uniform spacing. On the upper side of the substrate S, which is made, for example, of ceramic, there are one or more integrated circuits, which, like the conductors leading outwardly to the edge contacts RK, are not shown in FIG. 2.

For the transformation of the substrate S with the edge contacts RK into a ball grid array BGA, first the upper side of the flexible circuit VF is connected over its whole surface with the underside of the substrate S by means of an adhesive K. This connection surface between the substrate S and the flexible circuit FV corresponds at least approximately to the core region KB shown in FIG. 1, so that the four projecting edge regions of the flexible circuit FV can be bent up and around the substrate S. The upward bending is facilitated by the additional openings ZSA and the regions of the support film TF, at the lower edges of the substrate S. In the bending of the edge regions of the flexible circuit FV around the upper edges of the substrate S, the free ends E of the conductors L are pressed onto allocated edge contacts RK, so that an electrically conductive connection can now be created between the ends E and the edge contacts RK. This contacting can take place by means of soldering with a soldering strap, by laser, infrared radiation, or the like, but the solder used must have a higher melting point than the temperature occurring in the processing as a ball grid array BGA. This contacting can also be achieved using fine welding methods, i.e. thermocompression, thermosonics, and ultrasound, or with adhesive methods. After the contacting, edge regions of the flexible support film TF that are still protruding and are not required can be separated if necessary.

On the underside of the flexible circuit FV adhered to the substrate S, the conductor layout can be covered with solder resist LSL except for the planarly distributed terminals A, followed by the creation of solder pads by applying solder paste, balls, or formed solder parts and melting them. A more detailed explanation of the manufacturing of such solder pads can be found, for example, in German PS 195 35 622 or in U.S. Pat. No. 5,284,287.

With the application of the solder pads or balls, designated here as meltable humps H, a processing as a ball grid array BGA is possible, with all the advantages that this constructive form offers over fine-grid edge contacts RK. If needed, the overall construction can be covered, injection-molded, encapsulated or provided with a cap. The last-named possibility is shown in FIG. 2 by means of a protective cap designated SK.

In the embodiment described above, all four edge sides of the substrate are occupied with edge contacts, however, the transformation into a ball grid array can also be carried out in an analogous fashion if only one edge side is occupied with edge contacts, or if two or three edge sides are occupied with edge contacts.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for transforming an integrated circuit substrate having edge contacts into a ball grid array, the method comprising the steps of:

providing said integrated circuit substrate with sides, edges and an upper surface, said edge contacts disposed on said upper surface adjacent said edges;

providing a flexible circuit having a conductor layout supported by a supporting film and having terminals disposed in a plane on an underside of said flexible circuit, said conductor layout having conductors proceeding outwardly from said terminals with said conductors having exposed ends;

providing a slot-shaped opening in said supporting film at a location adjacent an upper corner of said substrate when said flexible circuit is bent upwardly and around said edges of said substrate;

disposing meltable solder humps respectively at said terminals of said flexible circuit;

mechanically connecting an upper side of said flexible circuit with said underside of said substrate with said flexible circuit projecting beyond said substrate at said edges of said substrate;

bending said flexible circuit upwardly and around said edges of said substrate so that the respective exposed ends of said conductors of said flexible circuit are disposed in registration with said edge contacts of said substrate; and producing an electrically conductive connection between said free ends of the respective conductors of said flexible circuit and said edge contacts of said substrate.

2. A method as claimed in claim 1, comprising the additional step of providing a slit-shaped opening in said supporting film of said flexible circuit at a location which will be adjacent to a lower corner of said substrate when said flexible circuit is bent upwardly and around said edge regions of said substrate.

3. A method as claimed in claim 1 comprising the additional step of covering said conductor layout of said flexible circuit with a solder resist, except at said terminals.

4. A method as claimed in claim 1 wherein the step of mechanically connecting said upper side of said flexible circuit with said underside of said substrate comprises attaching said upper side of said flexible circuit to said underside of said substrate with an adhesive.

5. A method for transforming an integrated circuit substrate having edge contacts into a ball grid array, the method comprising the steps of:

provautomating said integrated circuit substrate with sides, edges and an upper surface, said edge contacts disposed on said upper surface adjacent said edges;

providing a flexible circuit having a conductor layout supported by a supporting film and having terminals disposed in a plane on an underside of said flexible circuit, said conductor layout having conductors proceeding outwardly from said terminals with said conductors having exposed ends;

providing a first slot-shaped opening in said supporting film at a region adjacent an upper corner of said substrate when said flexible circuit is bent upwardly and around said substrate;

providing a second slot-shaped opening in said supporting film at a region adjacent a lower corner of said substrate when said flexible circuit is bent upwardly and around of said substrate;

disposing meltable solder humps respectively at said terminals of said flexible circuit;

mechanically connecting an upper side of said flexible circuit with said underside of said substrate with said flexible circuit projecting beyond said substrate at said edges of said substrate;

bending said flexible circuit upwardly and around said edges of said substrate so that the respective exposed ends of said conductors of said flexible circuit are disposed in registration with said edge contacts of said substrate; and producing an electrically conductive connection between said free ends of the respective conductors of said flexible circuit and said edge contacts of said substrate.

\* \* \* \* \*